(12) United States Patent
Maruyama

(10) Patent No.: US 9,818,927 B2
(45) Date of Patent: Nov. 14, 2017

(54) VIBRATION ELEMENT, METHOD FOR MANUFACTURING SAME, AND VIBRATION-TYPE DRIVING DEVICE

(71) Applicant: CANON KABUSHIKI KAISHA, Tokyo (JP)

(72) Inventor: Yutaka Maruyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 589 days.

(21) Appl. No.: 14/174,699

(22) Filed: Feb. 6, 2014

(65) Prior Publication Data

US 2014/0225478 A1 Aug. 14, 2014

(30) Foreign Application Priority Data

Feb. 8, 2013 (JP) ................. 2013-023657

(51) Int. Cl.
*H01L 41/08* (2006.01)
*H01L 41/09* (2006.01)
*H01L 41/314* (2013.01)
*H02N 2/00* (2006.01)
*H02N 2/02* (2006.01)
*H02N 2/10* (2006.01)

(52) U.S. Cl.
CPC ...... *H01L 41/0815* (2013.01); *H01L 41/0986* (2013.01); *H01L 41/314* (2013.01); *H02N 2/002* (2013.01); *H02N 2/0015* (2013.01); *H02N 2/026* (2013.01); *H02N 2/103* (2013.01); *Y10T 29/42* (2015.01)

(58) Field of Classification Search
CPC ................. H01L 41/0815; H01L 41/0986

USPC .................................................. 310/311–371
See application file for complete search history.

(56) References Cited

U.S. PATENT DOCUMENTS

| 2,842,448 | A | * | 7/1958 | Dereich | .................. C04B 24/04 |
| | | | | | 106/634 |
| 7,441,317 | B2 | | 10/2008 | Koizumi et al. | |
| 9,083,264 | B2 | | 7/2015 | Maruyama | |
| 2007/0080317 | A1 | * | 4/2007 | Iezumi | .................. C04B 35/493 |
| | | | | | 252/62.9 PZ |
| 2011/0025168 | A1 | | 2/2011 | Maruyama | |
| 2011/0291525 | A1 | * | 12/2011 | Maruyama | .......... H02N 2/0015 |
| | | | | | 310/334 |
| 2012/0153774 | A1 | | 6/2012 | Maruyama | |

FOREIGN PATENT DOCUMENTS

| JP | 2842448 B2 | 1/1999 |
| JP | 2004200382 A | 7/2004 |
| JP | 2004304887 A | 10/2004 |

(Continued)

*Primary Examiner* — Thomas Dougherty
*Assistant Examiner* — Karen B Addison
(74) *Attorney, Agent, or Firm* — Canon U.S.A., Inc. IP Division

(57) ABSTRACT

A vibration element includes: a substrate; a ceramic layer containing molten glass and provided on the substrate; and a piezoelectric element fixed to the substrate with the ceramic layer therebetween, wherein the piezoelectric element includes a first electrode layer provided in contact with the ceramic layer, a second electrode layer, and a piezoelectric layer provided between the first electrode layer and the second electrode layer, and the first electrode layer has a thickness larger than that of the second electrode layer.

11 Claims, 12 Drawing Sheets

(56) References Cited

FOREIGN PATENT DOCUMENTS

| | | | |
|---|---|---|---|
| JP | 2006165007 | A | 6/2006 |
| JP | 2006229154 | A | 8/2006 |
| JP | 2009124791 | A | 6/2009 |
| JP | 2011029537 | A | 2/2011 |
| JP | 2011217493 | A | 10/2011 |
| JP | 2011254569 | A | 12/2011 |
| JP | 2012015758 | A | 1/2012 |
| JP | 2012020918 | A | 2/2012 |

* cited by examiner

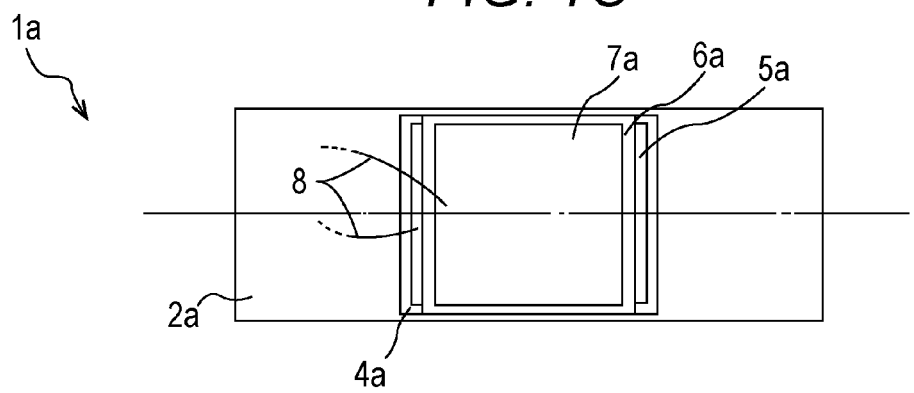
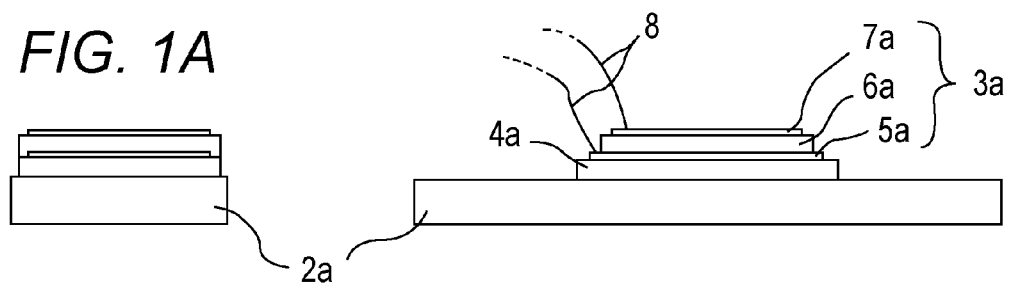

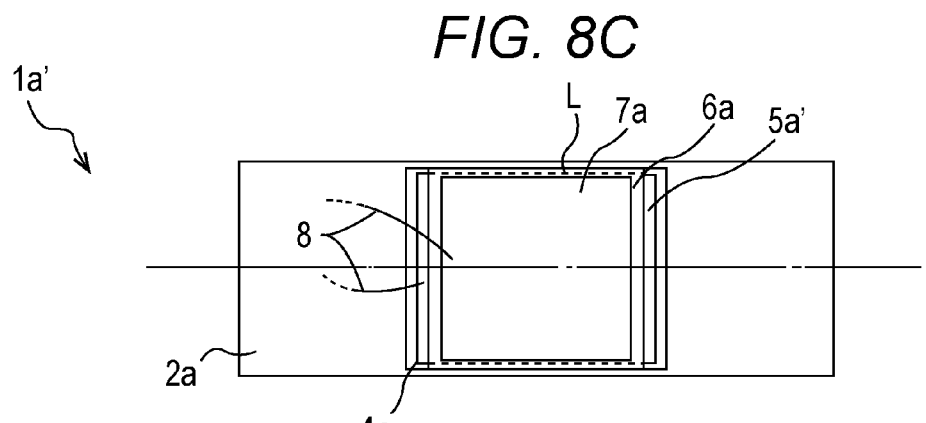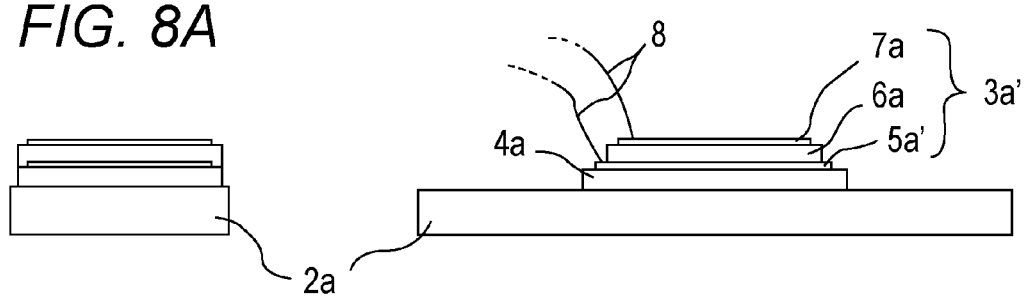

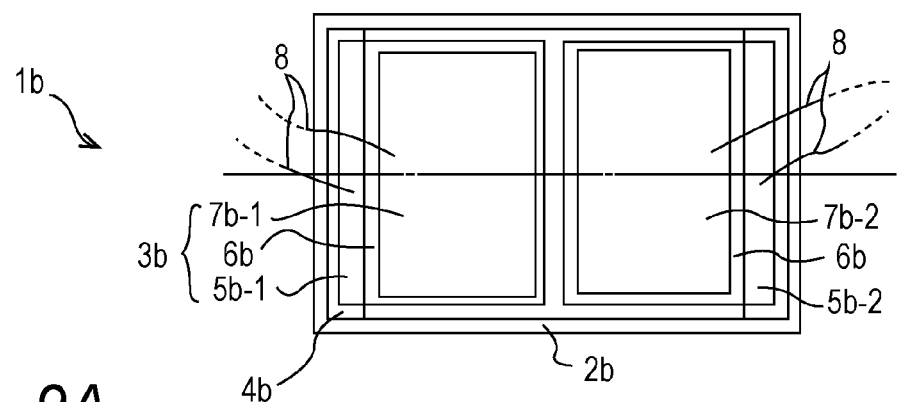
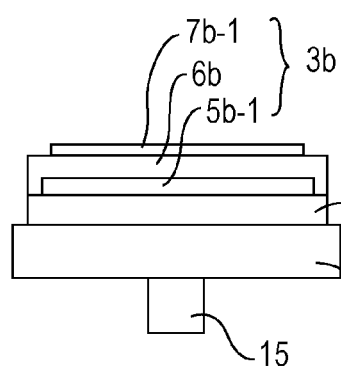
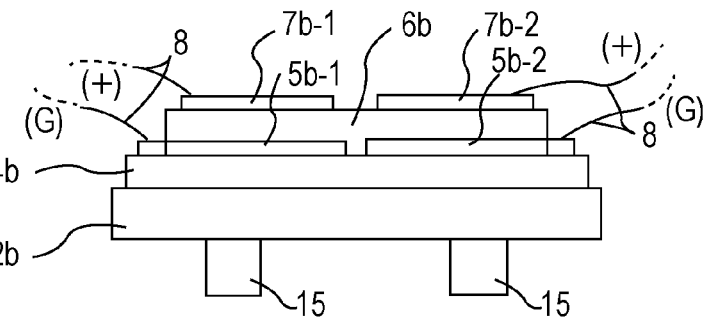

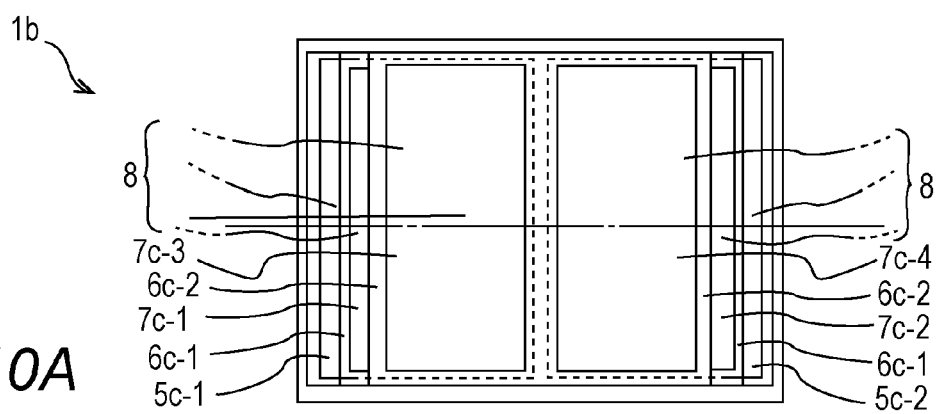
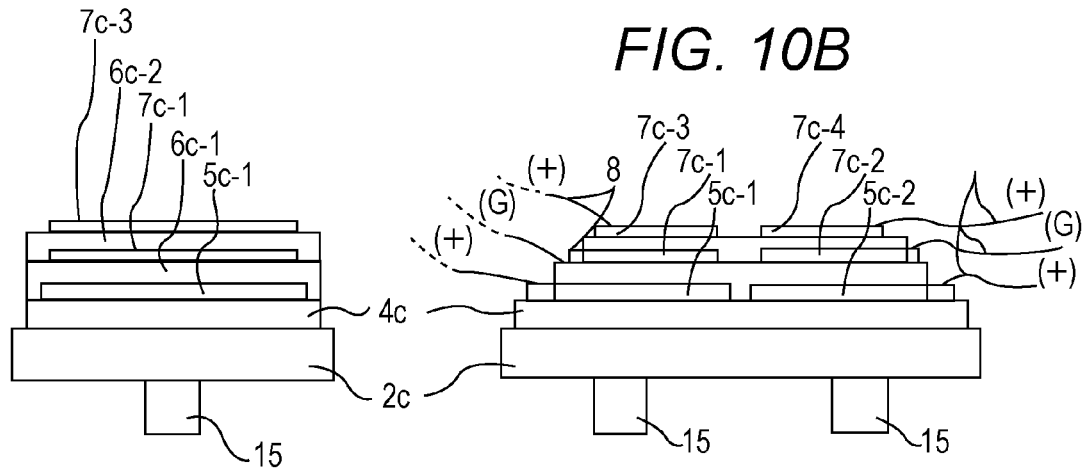

VIBRATION ELEMENT, METHOD FOR MANUFACTURING SAME, AND VIBRATION-TYPE DRIVING DEVICE

BACKGROUND OF THE INVENTION

Field of the Invention

The present invention relates to a vibration element, a method for manufacturing the same, and a vibration-type driving device, and in particular to a vibration element having a substrate and a piezoelectric element fixed thereon, a method for manufacturing the same, and a vibration-type driving device including the vibration element.

Description of the Related Art

In related art, a vibration-type driving device (vibration wave actuator) typically includes a piezoelectric element that functions as a vibration source of a vibration element (also referred to as a vibrator).

Examples of the piezoelectric element include a single plate-like piezoelectric element and a more recent multi-layer piezoelectric element having multiple piezoelectric layers and electrode layers stacked alternately as disclosed in Japanese Patent Application Laid-Open No. 2004-304887.

FIG. 12 is an outline perspective view of a linear, vibration-type driving device 20 (an ultrasonic actuator, for example) according to Japanese Patent Application Laid-Open No. 2004-304887.

The linear, vibration-type driving device 20 includes a vibration element 21 and a linear slider 26 that is a driven element in pressure contact therewith.

The vibration element 21 has a multi-layer piezoelectric element 23 and a vibration plate 22. The multi-layer piezoelectric element 23 has multiple piezoelectric layers and electrode layers stacked alternately. The vibration plate 22 is made of metal and bonded to the multi-layer piezoelectric element 23 with a resin adhesive.

The vibration plate 22 made of metal has a plate portion formed into a rectangular shape and two protruding portions 24 each formed into a protrusive shape on the top surface of the plate portion. The protruding portions 24 each have a contact portion 25 on a top surface thereof. The contact (friction) portions 25, which are members brought into direct contact with the linear slider 26 that is a driven element, are made of alumina (aluminum oxide) that is abrasion resistant ceramics.

The shape of the vibration element 21 of the linear, vibration-type actuator 20 is determined so that the resonance frequencies in two flexural vibration modes, which are a primary flexural vibration mode in the long-axis direction and a secondary flexural vibration mode in the short-axis direction, approximately coincide with each other. Input of predetermined high-frequency voltages having phases different from each other by approximately $\pi/2$ causes the vibration element 21 to be excited, which excites circular movement or elliptical movement of the protruding portions 24.

The circular movement or elliptical movement generates a force to move the linear slider 26 in pressure contact with the vibration element 21 relative to the vibration element 21 with the frictional force.

The relative movement force allows the linear slider 26 to be driven in a linear reciprocating manner as shown by the arrow.

Such a multi-layer piezoelectric element 23 can be produced as follows. First, green sheets to be piezoelectric layers are formed from a piezoelectric powder material and an organic binder by such a method as the doctor blade method, and an electrode paste material is printed on predetermined positions on the green sheets to produce electrode layers.

Subsequently, a predetermined number of such green sheets are stacked in a planar state and pressurized to form a laminate. Thereafter, the piezoelectric layers and the electrode layers are integrated by being sintered together, then subjected to poling, and finally subjected to machining to be finished into a predetermined size.

Furthermore, Japanese Patent No. 2842448 proposes a piezoelectric/electroresistive actuator having an integrated multilayered structure formed by sequentially stacking an electrode material and a piezoelectric material into a laminate on at least one surface of a substrate and integrating the stacked materials by heat treatment.

Moreover, Japanese Patent Application Laid-Open No. 2011-254569 proposes a vibration element in which a piezoelectric element having piezoelectric layers and electrode layers is fixed onto a substrate and which causes the substrate to vibrate by vibration energy of the piezoelectric element.

The vibration element includes a bonding layer that is a ceramic layer containing glass powder between the piezoelectric element and the substrate. The piezoelectric element is fixed to the substrate with the bonding layer therebetween by sintering.

In the vibration element 21 of the vibration-type driving device of the related art disclosed in Japanese Patent Application No. 2004-304887 illustrated in FIG. 12 mentioned above, the multi-layer piezoelectric element 23 and the vibration plate (hereinafter referred to as a substrate) 22 made of metal are bonded with a resin adhesive.

The resin adhesive, however, is softer than the piezoelectric element and the metal, which makes the vibration damping of the vibration element larger and, particularly when the temperature of the resin is higher, lowers the efficiency of the vibration-type driving device. Furthermore, as the vibration-type driving device is made smaller, influences of the variation in the thickness of the bonding layer of the adhesive and of the positional accuracy of the bonding on the performance of the small vibration-type driving device become larger and the variation in the performance of the small vibration-type driving device thus becomes larger.

Moreover, the method for manufacturing multi-layer piezoelectric elements of the related art requires a high amount of equipment investment for such manufacturing equipment as a machine for forming green sheets from the piezoelectric powder material, a laminating press, and a processing machine, which contributes to an increase in the manufacturing cost.

An attempt is thus made to directly fix (bond) the multi-layer piezoelectric element onto the substrate without providing a bonding layer of an adhesive simultaneously with production of the multi-layer piezoelectric element as disclosed in Japanese Patent No. 2842448 of the related art mentioned above.

The ceramic substrate and the electrode layers made of noble metal, however, are less chemically reactive and lower in bonding strength. The piezoelectric element thus has such problems that the piezoelectric element is likely to be separated from the ceramic substrate during sintering and is also separated by vibration of the actuator.

A vibration element produced as follows as disclosed in Japanese Patent Application No. 2011-254569 of the related art mentioned above is thus proposed. The vibration element is produced by sintering the piezoelectric element and the ceramic substrate together with the bonding layer containing glass powder provided therebetween, and melting the glass powder to bond the piezoelectric element and the substrate to each other.

Such a structure, however, also has a problem that the normally expected piezoelectric property cannot be achieved, and it has been desired to solve these problems to improve the performance of the vibration element.

SUMMARY OF THE INVENTION

An aspect of the present invention relates to a vibration element capable of suppressing vibration damping due to a structure at a lower cost and a smaller size, lowering vibration energy loss due to vibration damping, and efficiently outputting vibration energy, a method for manufacturing the vibration element, or a vibration-type driving device.

An aspect of the present invention relates to a vibration element including: a substrate; a ceramic layer containing molten glass and provided on the substrate; and a piezoelectric element fixed to the substrate with the ceramic layer therebetween, wherein the piezoelectric element includes a first electrode layer provided in contact with the ceramic layer, a second electrode layer, and a piezoelectric layer provided between the first electrode layer and the second electrode layer, and the first electrode layer has a thickness larger than that of the second electrode layer.

Another aspect of the present invention relates to a method for manufacturing a vibration element, including: forming a ceramic layer containing molten glass on a substrate; stacking a first electrode layer, a piezoelectric layer, and a second electrode layer in this order on the ceramic layer, the first electrode layer having a thickness larger than that of the second electrode layer; and simultaneously sintering the ceramic layer, the first electrode layer, the piezoelectric layer, and the second electrode layer to integrate and bond the layers onto the substrate.

Further features of the present invention will become apparent from the following description of exemplary embodiments (with reference to the attached drawings).

BRIEF DESCRIPTION OF THE DRAWINGS

FIGS. 1A, 1B, and 1C are a front view, a side view, and a plan view, respectively, explaining an example structure of a vibration element;

FIGS. 8A, 8B, and 8C are a front view, a side view, and a plan view, respectively, illustrating an example structure of an improved vibration element;

FIGS. 9A, 9B, and 9C are a front view, a side view, and a plan view, respectively, illustrating an example structure of a vibration element;

FIGS. 10A, 10B, and 10C are a front view, a side view, and a plan view, respectively, illustrating an example structure of a vibration element;

DESCRIPTION OF THE EMBODIMENTS

Figure 2:
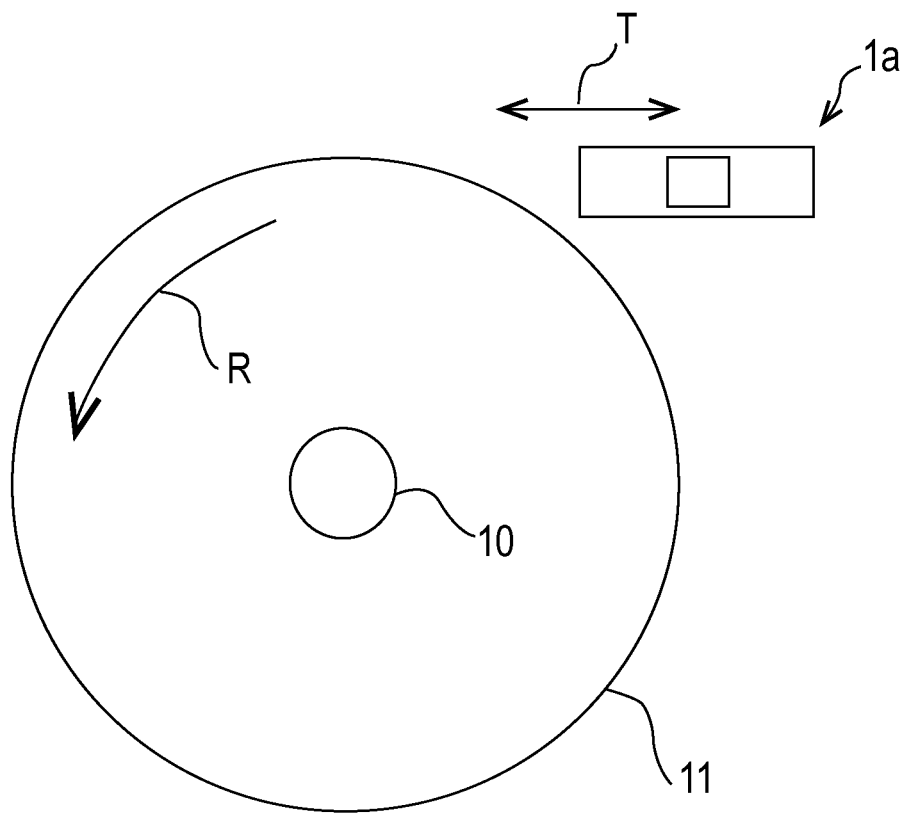
FIG. 2 is a diagram illustrating a vibration-type driving device in which the vibration element is integrated.

Modes in which the present invention is carried out will be described by way of the following embodiments.

EMBODIMENTS

First Embodiment

An example of a vibration element according to a first embodiment will be described with reference to FIGS. 1A to 1C. Specifically, a vibration element 1a of the present embodiment is a vibration element configured to generate longitudinal vibration and to be applied to a vibration-type driving device. FIG. 1B illustrates a cross section taken along a center line (an alternate long and short dash line) shown in FIG. 1C.

The vibration element 1a of the present embodiment includes a substrate 2a and a piezoelectric element 3a having a piezoelectric layer and electrode layers and bonded to the substrate 2a, and is configured to cause the substrate 2a to vibrate by vibration energy of the piezoelectric element 3a and output vibration energy of the vibration element 1a.

The vibration element 1a has the plate-like substrate 2a and the piezoelectric element 3a, and is provided with a ceramic layer 4a containing molten glass that is glass powder which had been molten by sintering between the substrate 2a and the piezoelectric element 3a. The piezoelectric element 3a includes an electrode layer 5a, a piezoelectric layer 6a, and an electrode layer 7a that are stacked in this order. One electrode layer 5a and the other electrode layer 7a are opposed to each other with the piezoelectric layer 6a therebetween.

As will be described later, the vibration element 1a is subjected to simultaneous sintering of the ceramic layer 4a on the substrate 2a, and the electrode layer 5a closer to the substrate, the piezoelectric layer 6a, and the electrode layer 7a constituting the piezoelectric element 3a together to bond and integrate the piezoelectric element 3a to the substrate 2a with the ceramic layer 4a therebetween that is a bonding layer. Specifically, the piezoelectric element 3a that functions as a vibration energy source and the substrate 2a that functions as a vibration plate vibrated by the vibration energy of the piezoelectric element 3a are bonded to each other with the ceramic layer 4a for bonding and integrated as the vibration element 1a.

Furthermore, electrical continuity with an external power source is achieved by bonding two conductive wires 8 to the electrode layers 5a and 7a with a conductive paste or solder.

A high-frequency voltage is supplied to the electrode layers 5a and 7a from the external power source for controlling vibration of the piezoelectric element 3a, which causes a piezoelectric active portion (a portion of the piezoelectric layer that is subjected to poling and exhibits piezoelectricity) of the piezoelectric layer 6a to stretch (to be distorted), and the stretching causes the substrate 2a to stretch together and is output as vibration energy from the vibration element 1a.

Since the vibration element 1a in which the piezoelectric element 3a is integrated with the substrate 2a with the ceramic layer 4a therebetween is subjected to poling to be described later, application of a voltage at a certain frequency to the electrode layers 5a and 7a can cause longitudinal vibration.

The longitudinal vibration can be utilized so that the vibration element 1a can be used as a vibration element of an actuator as in FIG. 2.

FIG. 2 illustrates a vibration-type driving device including the vibration element 1a, in which the vibration element 1a according to the present invention is used as a driving power source to rotate a disc 11 having a rotation axis 10.

In FIG. 2, when the vibration element 1a is caused to generate longitudinal vibration in the direction of an arrow T and positioned so that a corner of the vibration element 1a is in contact with the surface of the disc 11, the disc 11 can be rotated in the direction of an arrow R.

Figure 3:
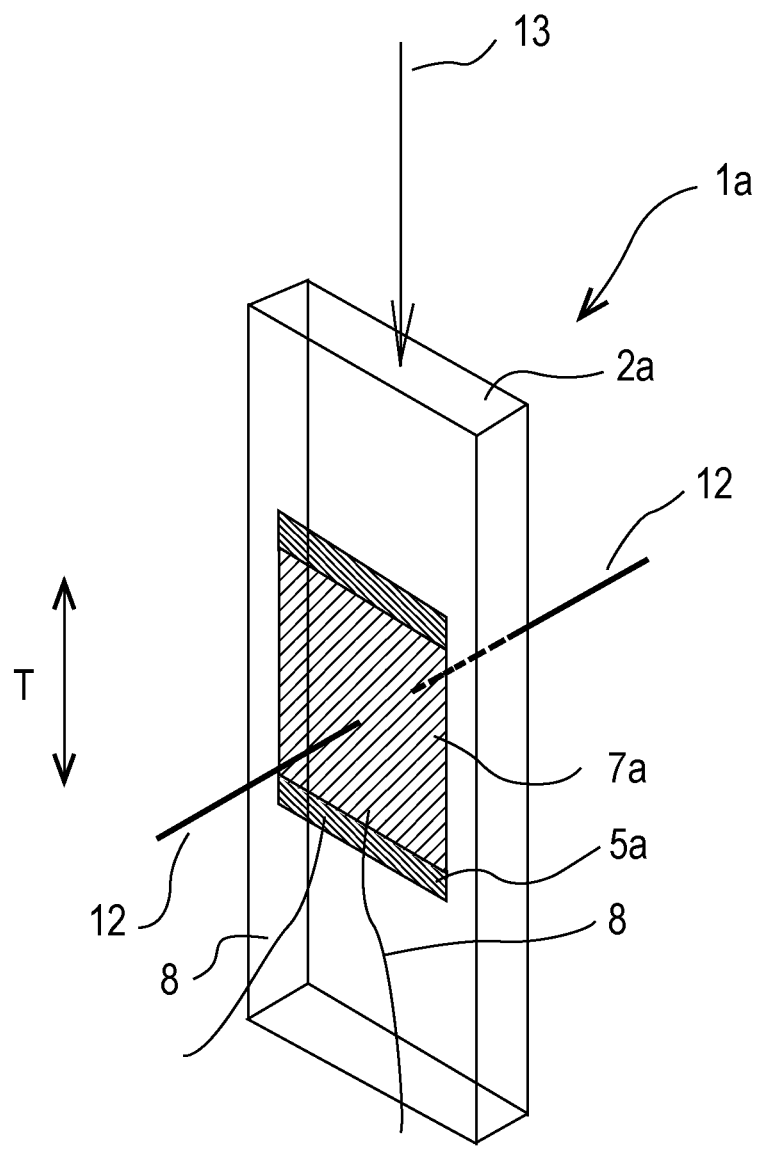
FIG. 3 is a diagram explaining a method for evaluating the performance of the vibration element and illustrating a supporting method during voltage application to the vibration element.

FIG. 3 illustrates a method for evaluating a vibration element in which a center portion of the vibration element 1a is held between two contact pins 12 and the vibration velocity of the longitudinal vibration (in the direction of the arrow T) of the vibration element 1a is measured with laser light 13 from a laser Doppler velocimeter.

In the vibration element 1a, a high-frequency voltage V is applied via the conductive wires 8 conducted to the electrode layers 5a and 7a, and the frequency of the high-frequency voltage V is swept from a frequency larger than a resonance frequency (approximately 190 KHz) of the longitudinal vibration to a smaller frequency.

A vibration velocity v at which the longitudinal vibration at resonance is maximum is then measured, and evaluated as the vibration characteristics (vibration performance) of the vibration element 1a.

As illustrated in FIGS. 1A to 1C, the piezoelectric element 3a is positioned at the center of the substrate 2a. The substrate 2a has a length of 25 mm, a width of 10 mm, and a thickness of 0.25 mm. The ceramic layer 4a has a length of 11 mm, a breadth of 8.5 mm, and a thickness of 10 μm. The piezoelectric layer 6a has a length of 9 mm, a breadth of 8.5 mm, and a thickness of 10 μm.

The electrode layer 7a has a length and a breadth of 8 mm, and a thickness of 2 to 3 μm that is a thickness of an electrode layer of a typical multi-layer piezoelectric element. This is to make the electrode layer as thin as possible to lower the cost because Pd that is an expensive noble metal is used as the electrode material.

Furthermore, the electrode layer 5a has a length of 10 mm and a breadth of 8 mm. The vibration velocity is measured while changing the average thickness of the electrode layer 5a to 3 μm, 5 μm, and 10 μm.

Note that the tolerance of the thickness of the electrode layer is made as small as possible but is about ±2 μm.

Figure 4:
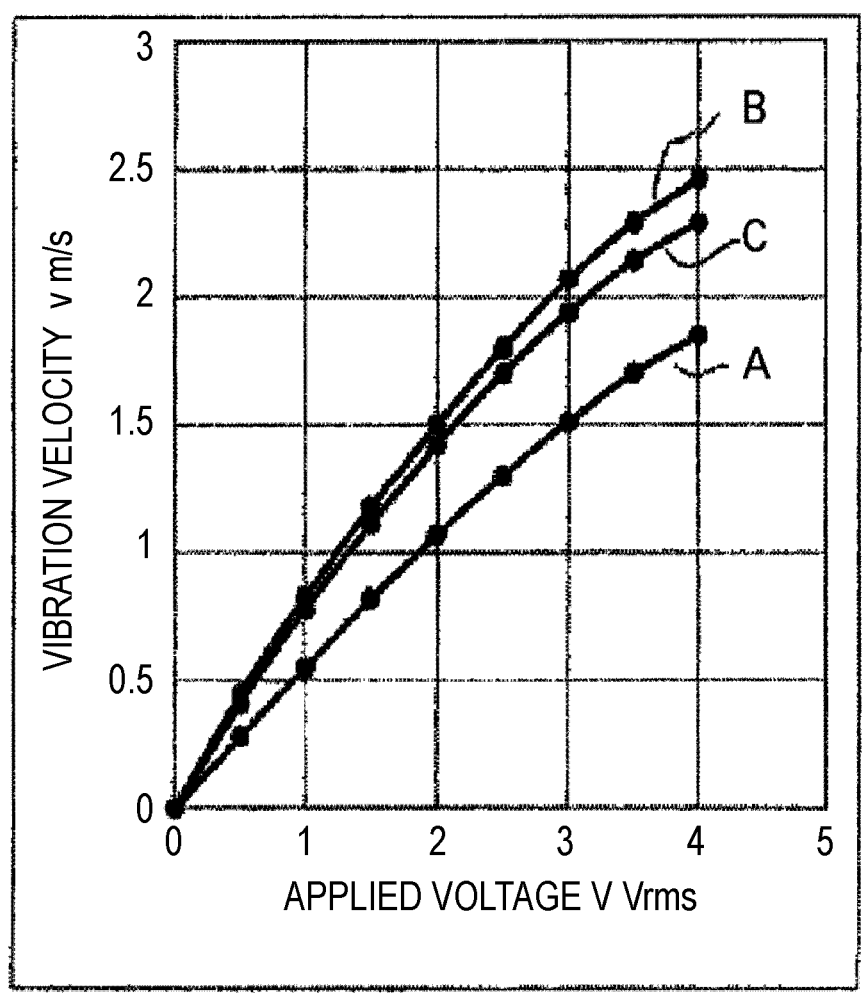
FIG. 4 is a graph showing the relation between applied voltage and vibration velocity that is a result of evaluating the performance of the vibration element.

FIG. 4 is a graph showing the relation between the applied voltage V (effective voltage V rms) and the maximum vibration velocity v (m/s). In FIGS. 4, A, B and C show cases where the average thickness of the electrode layer 5a is 3 μm, 5 μm, and 10 μm, respectively.

The vibration velocity v is higher as the voltage V is higher. When the voltage V is raised to approximately 4 V, the vibration velocity v reaches 2 m/s or higher in B and C but is lower than 2 m/s in A.

Specifically, the vibration velocity is low in the case of A where the thickness of the electrode layer is 3 μm, which is a result in which the characteristics are greatly different from the cases of B where the thickness of the electrode layer is 5 μm and C where the thickness of the electrode layer is 10 μm. Although not shown in FIG. 4, it is also possible to raise the vibration velocity v to 2 m/s or higher in the case of A where the thickness of the electrode layer is 3 μm by further raising the applied voltage to increase input energy.

Furthermore, the vibration velocity v is also increased in the cases of B and C by raising the applied voltage to higher than 4 V to further increase the input energy.

Even when the input energy is increased, however, the energy is converted to heat (increase the temperature) of the vibration element 1a and the vibration velocity thus does not reach 3 m/s or higher.

To figure out the cause of the difference in the vibration velocity v between A and B, and C, the vibration element 1a was cut, the section was polished, and observation of the crystalline structures and elemental analysis of the substrate, the ceramic layer, the electrode layers, and the piezoelectric layer were conducted under an electron microscope.

Normally, the vibration element 1a is formed by stacking the ceramic layer 4a, the electrode layer 5a, the piezoelectric layer 6a, and the electrode layer 7a on the substrate 2a in this order from the substrate 2a by a screen printing method, which will be described later, and simultaneously sintering the layers. The ceramic layer, the electrode layers, and the piezoelectric layer result in sintering shrinkage.

It is expected that shrinkage occurs in the electrode layers made of metal earlier at lower temperatures than in the ceramic layer and the piezoelectric layer, and that dense metal layers are formed at an early stage of sintering (about 200 to 500° C.).

Since formation of the dense electrode layers as a result of shrinkage occurs at the melting temperature (about 700° C.) of the glass contained in the ceramic layer, it is expected that the electrode layers made of dense metal function as barriers preventing the molten glass from intruding into the piezoelectric layer. According to the observation of the crystalline structure and elemental analysis of the piezoelectric active portion of the piezoelectric layer with the average thickness of the electrode layer of 3 μm, 5 μm, and 10 μm, crystal particles of the piezoelectric ceramic had sizes of 1 to 2 μm, which were substantially uniform over the piezoelectric layer, when the thickness of the electrode layer was 5 μm and 10 μm.

When the thickness of the electrode layer was 3 μm, however, many groups of smaller crystal particles having sizes of 0.5 to 1 μm were formed in part of the piezoelectric layer, and Si (silicon) elements were detected around the smaller crystal particles.

Furthermore, part of the electrode layer near the groups of the smaller crystal particles was observed to be a thin portion having a thickness of about 1 μm.

There is little electrical problem with such a thin electrode layer, but it is anticipated that molten glass containing Si elements in the ceramic layer 4a intrudes into the piezoelectric layer through the electrode layer during sintering. This is because the thin electrode layer may not be sufficiently dense.

Furthermore, there may be a tiny portion where the electrode layer is deficient.

Figure 5:
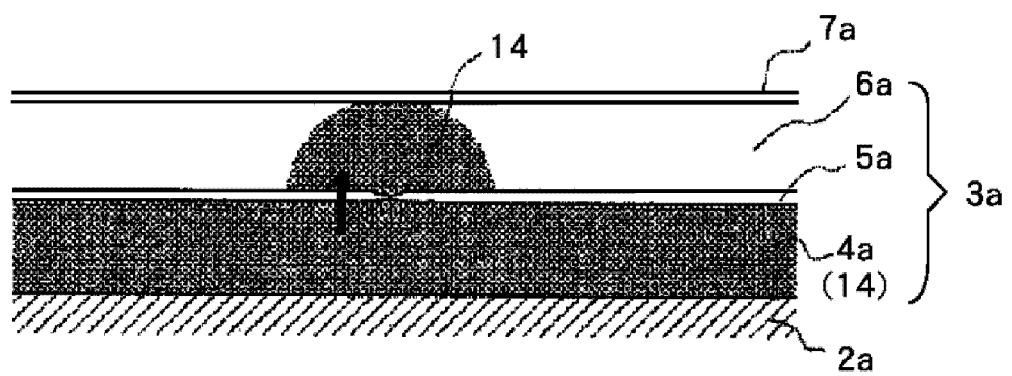
FIG. 5 is a schematic view explaining intrusion of molten glass into a piezoelectric active portion of a piezoelectric layer through an electrode layer.

FIG. 5 is a schematic view of such an example of the related art in which molten glass 14 (shown by hatching) intrudes into the piezoelectric layer through the imperfect portion of the electrode layer 5a in contact with the ceramic layer 4a.

At high temperatures, it is anticipated that molten glass contained in the ceramic layer 4a passes through the electrode layer 5a (shown by an arrow) and intrudes into the piezoelectric active portion of the piezoelectric layer 6a to form small crystalline particles that do not have normal piezoelectricity different from that of the particles of the piezoelectric ceramics.

As a result, it can be deemed that, with the electrode layer having a thickness of 3 µm, the piezoelectric property of the piezoelectric active portion of the piezoelectric layer is degraded and the vibration velocity is lower as described above.

Consequently, it is possible to prevent intrusion of molten glass into the piezoelectric layer by making the thickness of the electrode layer larger than 5 µm, which is larger than that of the electrode layer 7a of a typical piezoelectric element.

Furthermore, regarding the difference between B and C where the thickness of the electrode layer is 5 µm and 10 µm, respectively, it can be deemed that the vibration loss increases with the thickness of the electrode layer.

Specifically, as the thickness of the electrode layer is larger, not only the cost of the electrode material made of noble metal increases but also the vibration loss increases in this manner and the vibration velocity lowers to a certain degree.

Since these adverse effects further increase with the electrode layer having a thickness of 10 µm or larger, the thickness of the electrode layer is preferably smaller than 10 µm.

Furthermore, according to observation and elemental analysis of the crystalline particles of the piezoelectric ceramics of the piezoelectric layer around an end of the electrode layer 5a, crystalline particles having sizes smaller than the size of crystalline particles of normal piezoelectric ceramics where observed in a piezoelectric active layer (to be described later) and Si elements were also detected.

As a result, it can be presumed that molten glass extends over the end of the electrode layer 5a and intrudes into part of the piezoelectric active portion of the piezoelectric layer 6a, affecting the piezoelectric active portion to degrade the piezoelectric property.

Figure 6:
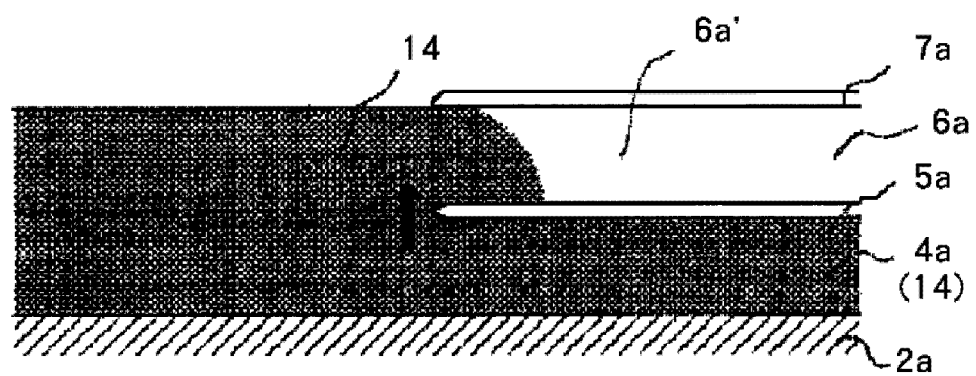
FIG. 6 is a schematic view explaining intrusion of molten glass into the piezoelectric active portion of the piezoelectric layer near an end of the electrode layer.

FIG. 6 is a schematic view of an example of the related art in which molten glass intrudes into the piezoelectric active portion 6a' of the piezoelectric layer 6a near the end of the electrode layer 5a in contact with the ceramic layer 4a of the vibration element 1a.

At high temperatures during sintering, the molten glass 14 (shown by hatching) contained in the ceramic layer 4a intrudes from around the end of the electrode layer 5a into the piezoelectric active portion 6a' between the electrode layer 5a and the electrode layer 7a and forms crystal particles that do not have normal piezoelectricity different from that of the particles of the piezoelectric ceramics.

The piezoelectric active portion between the electrode layer 5a and the electrode layer 7a is a layer actually causing displacement, and the piezoelectric property of this layer relates directly to the vibration characteristics of the vibration element and the performance of the vibration-type driving device.

Figure 7:
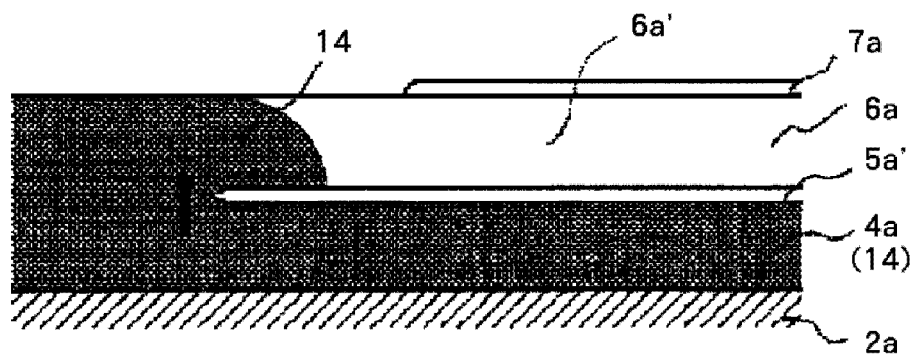
FIG. 7 is a schematic view illustrating an example structure in which the electrode layer is enlarged and molten glass does not intrude into the piezoelectric active portion of the piezoelectric layer near the end of the electrode layer.

FIG. 7 illustrates an example structure in which electrode layer is enlarged to prevent intrusion of molten glass into the piezoelectric active portion of the piezoelectric layer near the end of the electrode layer according to the present embodiment.

As illustrated in FIG. 7, the electrode layer 5a in contact with the ceramic layer 4a of the vibration element 1a is enlarged to have a large area.

As a result of enlarging the electrode layer 5a in this manner, molten glass 14 (shown by hatching) intruding from around the end of the electrode layer 5a into the piezoelectric layer 6a does not intrude to the piezoelectric active portion 6a' between the electrode layer 5a and the electrode layer 7a, and degradation in the piezoelectric property is thus not caused.

Furthermore, FIGS. 8A to 8C illustrate an example structure of an improved vibration element according to the present embodiment.

As illustrated in FIGS. 8A to 8C, two sides L of the electrode layer 5a' of the vibration element 1a' are enlarged by about 0.05 mm from the size of the electrode layer 5a of the vibration element 1a of FIGS. 1A to 1C, that is, the electrode layer 5a' is enlarged to have a length of 10 mm and a breadth of 8.1 mm, which is larger than the electrode layer 7a.

Note that the printing positional accuracy and the patterning accuracy of screen printing are typically about ±20 to 30 in total in this case, and the amount by which the electrode layer 5a' is enlarged is determined to be 0.05 mm taking the accuracy and the intrusion state of molten glass into account.

The amount by which the electrode layer 5a' is enlarged may of course be larger than 0.05 mm, but the unused range of the electrode increases if the amount is too large. The amount of about 0.5 mm is sufficient considering undefined factors that degrade the printing positional accuracy, the patterning accuracy and other accuracy.

Specifically, the piezoelectric active portion of the piezoelectric layer that actually exhibits activity of the piezoelectricity is normally the portions of the two electrode layers that actually face each other with the piezoelectric layer therebetween.

Thus, the two opposed electrode layers normally have the same size, and the piezoelectric property will not change even if the electrode layer 5a is enlarged to be larger than the electrode layer 7a as described above (if there is no influence of molten glass).

In the vibration element 1a of the present example, however, the molten glass passes outside of the electrode layer 5a and intrudes into the piezoelectric layer 6a, which degrades the piezoelectric active portion. Thus, in the vibration element 1a', the two sides L of the electrode layer 5a' are preferably larger in dimension than the electrode 7a as in FIG. 8C in plan view to keep the piezoelectric active portion from being affected by molten glass. Specifically, the area of one electrode 5a' is made larger than that of the other electrode 7a by a range of 0.05 mm to 0.5 mm in the length of one side. In the example of the vibration element 1a' of the present embodiment, the two sides other than the sides L of the electrode 5a' are larger in dimension than those of the electrode 7a, which does not cause intrusion of molten glass owing to the structure of the piezoelectric active portion and the electrode 5a'.

In particular, if the sizes of the substrate and the electrode layers become smaller sometime in the future in the structure of the electrode layers and the piezoelectric layer as in FIG. 6, the influence of molten glass intruding into the piezoelectric active portion will be larger and unignorable.

Next, a method for producing the vibration element 1a and the vibration element 1a' will be described.

First, in FIGS. 1A to 1C or FIGS. 8A to 8C, sintered plate-like ceramics is subjected to grinding and cutting to be finished into a predetermined size as the substrate 2a.

Subsequently, a ceramic powder paste made by mixing ceramic powder, glass powder to be described later, an organic solvent, and an organic vehicle made of an organic binder and capable of forming a thick film is printed to coat one surface of the substrate 2a by the screen printing method.

The coating ceramic powder paste in which glass powder is mixed is heated at approximately 150° C. for about 10 minutes so that the organic solvent is removed therefrom and the paste is dried to form the ceramic layer 4a.

Note that the surface of the substrate 2a of ceramics forming the ceramic layer 4a is preferably a smooth surface having a surface roughness (Japanese Industrial Standards: JIS B0601-2001) Rz of 2 μm or smaller.

This is because the surface roughness of the ceramic layer 4a also becomes larger than 1 μm if the surface roughness Rz is larger than 2 μm, which is one cause of preventing the electrode layer 5a from being formed to be flat.

Subsequently, the electrode layer 5a is formed on the ceramic layer 4a as follows. A conductive material powder paste made by mixing conductive material powder in which piezoelectric powder is mixed in advance, an organic solvent, and an organic vehicle made of an organic binder is coated onto the ceramic layer 4a by the screen printing method, heated at approximately 150° C. for about 10 minutes and dried to form the electrode layer 5a.

Furthermore, a piezoelectric material powder paste made by mixing piezoelectric material powder, an organic solvent, and an organic vehicle made of an organic binder and capable of forming a thick film is printed to coat a surface of the electrode 5a by the screen printing method. Note that the thicknesses of the electrode layers including the electrode layer 5a, the piezoelectric layer, and the ceramic layer can be changed by changing the mesh thickness and the opening ratio of the plate for screen printing and the printing conditions.

Subsequently, the coated piezoelectric material powder paste is heated at approximately 150° C. for about 10 minutes so that the organic solvent is removed and the paste is dried to form the piezoelectric layer 6a.

Subsequently, similarly to the electrode layer 5a, the conductive material powder paste is coated onto the piezoelectric layer 6a by the screen printing method and dried to form the electrode layer 7a.

As described above, coating and drying are sequentially repeated to form the ceramic layer 4a, the electrode layer 5a, the piezoelectric layer 6a, and the electrode layer 7a onto the substrate 2a.

The thus formed ceramic layer 4a on the substrate 2a and the thus formed piezoelectric element 3a including the electrode layer 5a, the piezoelectric layer 6a, and the electrode layer 7a stacked on the ceramic layer are in an unsintered state.

Thus, the piezoelectric element 3a is heated from room temperature to 500° C. by using an electric furnace to remove the organic binder, and then sintered at 900 to 950° C. in a lead atmosphere.

Specifically, the electrode layer 5a, the piezoelectric layer 6a, the electrode layer 7a, and the substrate 2a are sintered simultaneously with the ceramic layer 4a to produce the piezoelectric element through sintering and bond (integrate) the piezoelectric element 3a to the ceramic layer 4a and the substrate 2a at the same time.

Thereafter, the conductive wires 8 are fixed and conducted to the electrode layers 5a and 7a with a conductive paste or solder, a voltage is applied across the electrode layers 5a and 7a via the conductive wires 8, and the piezoelectric layer 6a is subjected to poling.

The conditions for poling are that a predetermined DC voltage (corresponding to approximately 1 V/μm per thickness of the piezoelectric layer 6a) is applied across the electrode layer 5a being grounded (G) and the electrode layer 7a being positive (+) on a hot plate heated to a high temperature of 170 to 200° C., and poling is performed for about 30 minutes.

The piezoelectric active portion of the piezoelectric layer 6a that is actually subjected to poling and exhibits activity of the piezoelectricity is a portion between the two electrode layers 5a and 7a opposed to each other with the piezoelectric layer 6a therebetween and across which the voltage is applied during poling.

The portion subjected to poling is a portion that can cause displacement as the piezoelectric active portion, and the piezoelectric property of the piezoelectric active portion in the piezoelectric layer relates directly to the vibration characteristics of the vibration element and the performance of the vibration-type driving device.

The material for the substrate 2a is preferably alumina (aluminum oxide) that is easily-available and inexpensive sintered ceramics and that is a material with smaller vibration damping than metal (a material for a vibration element with smaller energy loss).

As the purity of alumina is lowered, the mechanical strength thereof is lowered and the vibration damping of the vibration element is larger. Thus, highly-pure alumina with a purity of 99.5% by weight or higher and 99.99% by weight or lower is more preferable. Furthermore, alumina is also suitable for contact (friction) portions of the vibration element of the vibration-type driving device since alumina is hard and excellent in abrasion resistance.

The material for the substrate 2a may be any material that is stably bonded to the ceramic layer 4a in which glass powder is mixed in advance.

In the cases where a typical ceramic substrate such as zirconia, silicon carbide, aluminum nitride or silicon nitride other than alumina is used as the substrate, glass powder is also mixed in advance in the ceramic layer 4a. Thus, the adhesion strength with the substrate 2 and the electrode layer 5a is enhanced by the glass component molten by sintering, allowing bonding of the piezoelectric layer 6a to the substrate 2 and the electrode layer 5a.

The piezoelectric material for forming the piezoelectric layer 6a contains as main components lead zirconate and lead titanate ($PbZrO_3$—$PbTiO_3$) having a perovskite crystalline structure containing lead. Furthermore, a piezoelectric material powder capable of sintering at low temperatures obtained by adding copper oxide to a ternary piezoelectric material powder to which a small amount of compound of multiple metallic elements is added and which is made into a solid solution is used.

The sintering temperature at which a good piezoelectric property can be obtained is 900 to 950° C. The sintering temperature can be lowered by approximately 200° C. than the piezoelectric material powder of the related art.

For the conductive material powder paste for forming the electrode layers 5a and 7a, a conductive material containing silver, or silver and palladium, or palladium alone as main components to which 15% by weight of piezoelectric material powder is added is used.

Since the conductive material powder paste is basically made of metal, the paste is easily and readily sintered at low temperatures and also shrinks greatly. Thus, the piezoelectric powder is mixed into the electrode layer 5a so that the shrinkage due to sintering of the conductive material powder is slightly suppressed to make the ceramic layer 4a and the piezoelectric layer 6a less likely to be separated.

The added piezoelectric material powder, however, may contain the same components or may contain the same main components of lead zirconate and lead titanate ($PbZrO_3$—$PbTiO_3$) as the piezoelectric layer 6a, which can produce the same effects. The mixing ratio of silver and palladium in the conductive material for forming the electrode layers is related to the sintering temperature, and the mixing ratio of palladium is adjusted within a range of 0 to 100% depending on the sintering temperature of the piezoelectric material. As the sintering temperature is higher, the mixing ratio of palladium needs to be increased and the melting temperature of the silver-palladium alloy needs to be increased.

At the sintering temperature of 900 to 950° C., sintering is possible with 100% by weight of silver with no palladium. Taking generation of electrical migration into account under high humidity conditions, however, 99 to 95% by weight of silver to which 1 to 5% by weight of palladium is added is desirable. In the present embodiment, the ceramic powder for the ceramic layer 4a is a ceramic powder paste obtained by adding glass powder to the same piezoelectric material powder as that for the piezoelectric layer 6a. The glass powder used here is glass powder containing silicon oxide and boron oxide, and mixed with bismuth oxide, alumina, alkali metal oxide, and alkali earth metal oxide. The glass powder (also referred to as a glass frit) is melted once and finely ground to have an average particle size of 1 to 2 μm.

About 0.2 to 10% by weight of the glass powder is added to the piezoelectric material powder and made into a paste. The softening point of the glass can be changed depending on the sintering temperature of the piezoelectric ceramics by changing the content ratio of silicon oxide and boron oxide.

Furthermore, chemical reaction can be enhanced depending on the material of the substrate by selecting the additional element to increase the bonding strength.

The glass powder contained in the ceramic layer 4a is molten to be softened, and fluidized, when sintered. Since a relatively large amount of molten glass resulting from melting the glass powder flows to the boundaries with the substrate 2a and the electrode 5a, the substrate and the ceramic layer are deemed to be chemically bonded easily.

As described above, the fluidized molten glass does not intrude into the piezoelectric layer 6a if the electrode layer 5a is a single layer made of completely dense metal. On the other hand, the molten glass reacts with the ceramic substrate 2a and with the ceramic layer 4a and maintains a strong bond therewith.

During vibration of the vibration element 1a, the piezoelectric active portion of the piezoelectric layer 6a stretches and vibrates but the ceramic layer 4a functions as a buffer for the substrate 2a to prevent breakdown of the piezoelectric element 3a.

An amount of glass powder smaller than 0.5% by weight of the weight of the ceramic powder produces little effect of bonding to the substrate 2a.

On the other hand, an amount of glass powder larger than 10% by weight results in high diffusion of molten glass component into the substrate 2a, degrades the mechanical properties of the substrate 2a, and also degrades the mechanical properties of the ceramic layer 4a itself, which are disadvantages of glass powder.

In view of the above, the amount of glass powder is 0.5% by weight or larger and 10% by weight or smaller of the weight of ceramic powder of the ceramic layer 4a.

Furthermore, the ceramic powder for the ceramic layer 4a may be any ceramics that is sintered at the sintering temperature of the piezoelectric element and has a mechanical strength effective to bonding of the substrate and the piezoelectric element.

For example, ceramic powder of the same material as the substrate (powder mainly containing alumina in the present example) has a good compatibility with the substrate and is thus preferable.

For a piezoelectric element made of a non-lead-based piezoelectric material other than the piezoelectric material powder made of lead zirconate and lead titanate as described above such as a barium titanate-based or bismuth sodium titanate-based material also having piezoelectricity, for example, it is also effective to use barium titanate-based or bismuth sodium titanate-based powder of the same kind.

Advantages of using glass powder in the ceramic layer for bonding are that chemical composition of glass material at a suitable sintering temperature and a suitable mechanical strength can be easily adjusted and that the ceramic layer can be applied to substrates of various materials.

Second Embodiment

An example structure of a vibration element according to a second embodiment different from that of the first embodiment will be described with reference to FIGS. 9A to 9C. FIG. 9A is a front view, FIG. 9B is a side view, and FIG. 9C is a plan view.

The vibration element 1b illustrated in FIGS. 9A to 9C is expected to be applied to a linearly-driving, vibration-type driving device presented as an example of the related art.

The manufacturing method, the substrate, the piezoelectric layer, the electrode layers, and the ceramic layer used here are basically the same as those in the first embodiment.

The vibration element 1b has a plate-like substrate 2b and a piezoelectric element 3b, and is provided with a ceramic layer 4b therebetween made of ceramics containing glass powder.

The substrate 2b and the piezoelectric element 3b with the ceramic layer 4b therebetween are fixed and integrated by simultaneous sintering as will be described later.

Specifically, the piezoelectric element 3b that functions as a vibration energy source is fixed and integrated to the substrate 2b that is vibrated by the vibration energy of the piezoelectric element 3b with the ceramic layer 4b therebetween. In the piezoelectric element 3b that functions as the vibration element 1b, electrode layers 5b-1 and 5b-2, a piezoelectric layer 6b, and electrode layers 7b-1 and 7b-2 are stacked in this order.

The electrode layer 5b is divided into two electrode layers 5b-1 and 5b-2 and is in an insulating state. Similarly, the electrode layer 7b is divided into two electrode layers 7b-1 and 7b-2 and is in an insulating state.

The two electrode layers 5b-1 and 5b-2 and the two electrode layers 7b-1 and 7b-2 are opposed to one another with the piezoelectric layer 6b therebetween.

Furthermore, electrical continuity with an external power source and poling are achieved by fixing conductive wires 8 onto the surfaces of the two electrode layers 5b-1 and 5b-2 and the two electrode layers 7b-1 and 7b-2 with a conductive paste or solder.

Subsequently, basically in the same manner as in the first embodiment, a voltage is applied across the electrode layers 5b-1 and 7b-1 being grounded (G) and the electrode layers 5b-1 and 7b-1 being positive (+) via the conductive wires 8 to perform poling on the portions of the piezoelectric layer 6b where the electrode layers are opposed. The conditions for poling are that a predetermined DC voltage (corresponding to approximately 1 V/μm per thickness of the piezoelectric layer 6b) is applied across the ground (G) and the positive (+) on a hot plate heated to a high temperature of 170 to 200° C., and poling is performed for about 30 minutes.

The substrate 2b has a length of 9 mm, a width of mm, and a thickness of 0.25 mm. Two protrusions 15 having a height of 0.25 mm are formed on a surface of the substrate 2b opposite to the surface on which the piezoelectric element 3b is provided by removing the part other than the protrusions 15 by blast processing.

The piezoelectric element 3b includes the electrode layers 5b-1 and 5b-2, the piezoelectric layer 6b, and the electrode layers 7b-1 and 7b-2.

The ceramic layer 4b has a length of 8.5 mm, a breadth of 5.5 mm, and a thickness of 10 μm. The electrode layers 5b-1 and 5b-2 each have a length of 3.3 mm, a breadth of 5.5 mm, and a thickness of 6 μm, and have a portion of 0.4 mm in width where no electrode is formed in the longitudinal direction at the center.

The piezoelectric layer 6b has a length of 6 mm, a breadth of 5.5 mm, and a thickness of 10 μm. The electrode layers 7b-1 and 7b-2 each have a length of 2.2 mm, a breadth of 4.8 mm, and a thickness of 3 μm, and have a portion of 0.6 mm in width where no electrode is formed in the longitudinal direction at the center.

In light of the result of the first embodiment, the electrode layers 5b-1 and 5b-2 are larger than the electrode layers 7b-1 and 7b-2 by about 0.2 mm in the longitudinal direction in plan view of FIG. 9C.

The two electrode layers 5b-1 and 7b-1 and the two electrode layers 5b-2 and 7b-2 are subjected to poling in advance and two high-frequency voltages having different phases are then supplied across the electrode layers from the external power source for controlling vibration of the piezoelectric element 3b.

The high-frequency voltages cause the piezoelectric active portions of the piezoelectric layer 6b facing the two electrode layers 5b-1 and 7b-1 and the two electrode layers 5b-2 and 7b-2 to stretch, the stretching is transmitted to the substrate 2b via the ceramic layer 4b, and the vibration element 1b as a whole vibrates.

Figure 11:
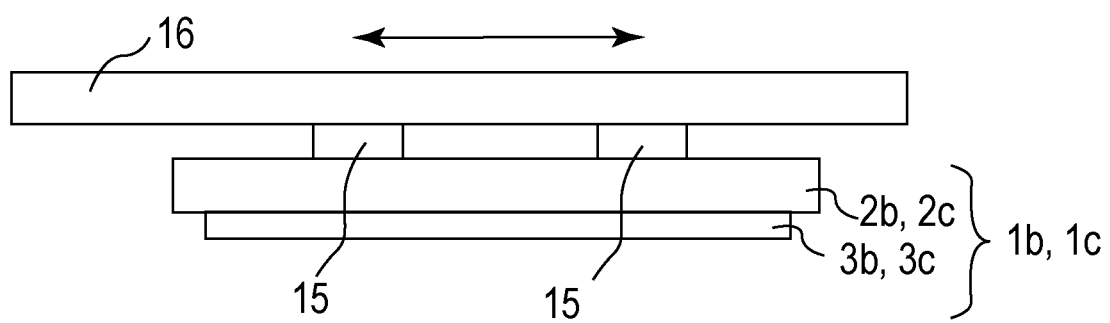
FIG. 11 is a diagram illustrating a linear, vibration-type driving device in which a vibration element is integrated.
Figure 12:
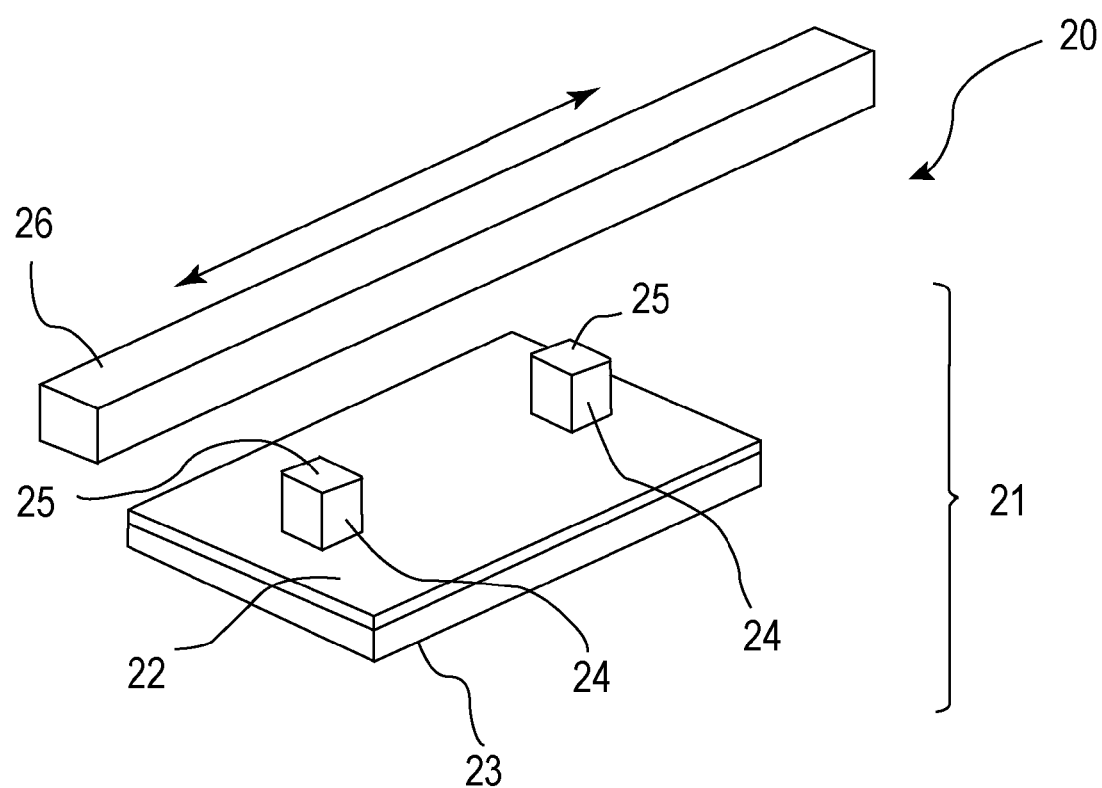
FIG. 12 is a diagram for explaining a linear, vibration-type driving device.

FIG. 11 is a diagram illustrating a structure of a linear, vibration-type driving device in which the vibration element 1b of the second embodiment is integrated.

The principle of linear drive is the same as that of the related art.

A linear slider 16 comes in pressure contact with the protrusions 15. Then, the substrate 2b is vibrated by the vibration of the piezoelectric element 3b, and excited elliptical movement of the protrusions 15 causes reciprocating movement in the direction of the arrow of the linear slider 16 that is a driven element. The protrusions 15 are also made of alumina similarly to the substrate 2b, and have abrasion resistance.

Third Embodiment

An example structure of a vibration element according to a third embodiment different from those of the first and second embodiment will be described with reference to FIGS. 10A to 10C. FIG. 10A is a front view, FIG. 10B is a side view, and FIG. 10C is a plan view. The vibration element 1c of the present embodiment includes the following layers stacked in the following order on a plate-like substrate 2c.

Electrode layers 5c-1 and 5c-2, a piezoelectric layer 6c-1, electrode layers 7c-1 and 7c-2, a piezoelectric layer 6c-2, and electrode layers 7c-3 and 7c-4 are stacked in this order forming a multi-layer piezoelectric element 3c on the plate-like substrate 2c with a ceramic layer 4c therebetween. The two separated electrode layers 5c-1 and 5c-2 are an insulating state. Similarly, the two separated electrode layers 7c-1 and 7c-2 and the two separated electrode layers 7c-3 and 7c-4 are in an insulating state. The two separated electrode layers 5c-1 and 5c-2 and the two separated electrode layers 7c-1 and 7c-2 are respectively opposed to each other with the piezoelectric layer 6c-1 therebetween.

Similarly, the two separated electrode layers 7c-1 and 7c-2 and the two separated electrode layers 7c-3 and 7c-4 are respectively opposed to each other with the piezoelectric layer 6c-2 therebetween.

While one piezoelectric layer 6b is used in the vibration element 1b according to the second embodiment, two piezoelectric layers 6c-1 and 6c-2 are used in the vibration element according to the third embodiment.

Thus, in the present embodiment, the multi-layer piezoelectric element additionally includes one piezoelectric layer and one electrode layer as compared to that of the second embodiment and the other structure is basically the same as that of the second embodiment.

The present embodiment in which the number of piezoelectric layers is increased to two can achieve lower voltages and higher displacement (distortion) than the second embodiment in which the number of piezoelectric layers is one.

It is also possible to use three or more piezoelectric layers to further lower the voltage.

In the vibration element 1c of the present embodiment, the piezoelectric element 3c includes the electrode layers 5c-1 and 5c-2, the piezoelectric layer 6c-1, the electrode layers 7c-1 and 7c-2, the piezoelectric layer 6c-2, and the electrode layers 7c-3 and 7c-4.

On the surface of the vibration element 1c opposite to the surface on which the piezoelectric element 3c is provided, two protrusions 15 are formed by removing the part other than the protrusions 15 by blast processing.

Furthermore, six conductive wires 8 are fixed onto the surfaces of the six electrode layers 5c-1, 5c-2, 7c-1, 7c-2, 7c-3, and 7c-4, which are obtained by separation of electrodes into two, with solder or the like for electrical continuity with an external power source and poling.

Thereafter, basically in the same manner as in the first embodiment, a voltage is applied across the electrode layers 5c-1 and 7c-1, across the electrode layers 7c-1 and 7c-3, across the electrode layers 5c-2 and 7c-2, and across the electrode layers 7c-2 and 7c-4 via the conductive wires 8, the electrode layers 7c-1 and 7c-2 being grounded (G) and the electrode layers 5c-1, 7c-3, 5c-2, and 7c-4 being positive (+).

Then, a predetermined DC voltage (corresponding to approximately 1 V/μm per thickness of the piezoelectric layers 6c-1 and 6c-2) is applied across the ground (G) and the positive (+) on a hot plate heated to a high temperature of 170 to 200° C., and poling is performed for about 30 minutes.

The portions of the piezoelectric layer 6c-1 and the piezoelectric layer 6c-2 subjected to poling between the electrode layers 5c-1 and 7c-1 and the electrode layers 5c-2 and 7c-2 are layers that can cause displacement as piezoelectric active portions, and the piezoelectric property of the layers relates directly to the vibration characteristics of the vibration element and the performance of the vibration-type driving device.

In the vibration element 1c of the present embodiment, the substrate has a length of 12 mm, a width of 9 mm, and a thickness of 0.25 mm. The protrusions 15 each have a height of 0.25 mm.

The ceramic layer 4c has a length of 11.5 mm, a breadth of 8.5 mm, and a thickness of 8 µm. The electrode layers 5c-1 and 5c-2 each have a length of 5.3 mm, a breadth of 8 mm, and a thickness of 6 µm, and have a portion of 0.4 mm in width where no electrode is formed in the longitudinal direction at the center.

The piezoelectric layer 6c-1 has a length of 10 mm, a breadth of 8.5 mm, and a thickness of 8 µm. The electrode layers 7c-1 and 7c-2 each have a length of 4.2 mm, a breadth of 7.8 mm, and a thickness of 3 µm, and have a portion of 0.6 mm in width where no electrode is formed at the center.

The piezoelectric layer 6c-2 has a length of 8 mm, a breadth of 8.5 mm, and a thickness of 8 µm. The electrode layers 7c-3 and 7c-4 each have a length of 3.2 mm, a breadth of 7.8 mm, and a thickness of 3 µm, and have a portion of 0.6 mm in width where no electrode is formed at the center.

The electrode layers 5c-1 and 5c-2 are larger than the electrode layers 7C-1 and 7c-2 by about 0.2 mm in the longitudinal direction in plan view of FIG. 10C.

High-frequency voltages having different phases are supplied across the electrode layers 5c-1, 7c-1, 7c-3 and the electrode layers 5c-2, 7c-2, 7c-4 from the external power source for controlling vibration of the piezoelectric element 3c.

This causes the piezoelectric active portions of the piezoelectric layer 6c-1 and the piezoelectric layer 6c-2 opposed to the electrode layers 5c-1, 7c-1, 7c-3 and the electrode layers 5c-2, 7c-2, 7c-4 to stretch (to be distorted), and the stretching is transmitted to the substrate 2c via the ceramic layer 4c, and the vibration element 1c as a whole vibrates.

FIG. 11 is a diagram illustrating a structure of a linear, vibration-type driving device in which the vibration element 1c of the third embodiment is integrated. The principle of linear drive is the same as that of the related art.

A linear slider 16 comes in pressure contact with the protrusions 15, the vibration element 1c is vibrated by the vibration of the piezoelectric element 3c, and excited elliptical movement of the protrusions 15 causes reciprocating movement in the direction of the arrow of the linear slider 16 that is a driven element.

In the embodiments described above, the electric continuity between the electrode layers and the external power source is achieved by using the conductive wires 8. Alternatively, the electric continuity between the electrode layers and the external power source may be achieved by using a flexible circuit board instead of the conductive wires 8.

The screen printing method for forming layers on a substrate facilitates formation of a thinner layer having a thickness with high accuracy as compared to stacking using the green sheets described above, and can also control the coating positions with high accuracy, eliminating the necessity of machine processing after sintering.

Furthermore, the manufacturing equipment is inexpensive, resulting in that the manufacturing cost is much lower than that of the piezoelectric elements of the related art.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-023657, filed Feb. 8, 2013, which is hereby incorporated by reference herein in its entirety.

What is claimed is:

1. A vibration element comprising:
    a substrate;
    a ceramic layer containing glass and provided on the substrate; and
    a piezoelectric element provided on the ceramic layer, wherein
    the piezoelectric element includes a first electrode layer provided in contact with the ceramic layer, a second electrode layer, and a piezoelectric layer provided between the first electrode layer and the second electrode layer, and
    the first electrode layer has a thickness larger than that of the second electrode layer,
    wherein the thickness of the first electrode layer is larger than 5 µm and smaller than 10 µm.

2. The vibration element according to claim 1, wherein the first electrode layer has an area larger than that of the second electrode layer.

3. The vibration element according to claim 2, wherein the first electrode layer has an area larger than that of the second electrode layer by 0.05 mm or longer in a length of a side.

4. The vibration element according to claim 2, wherein the first electrode has an area larger than that of the second electrode layer by a range of 0.05 mm to 0.5 mm in a length of a side.

5. The vibration element according to claim 1, wherein glass components in the molten glass of the ceramic layer include silicon oxide and boron oxide as main components, and
    the glass component is added in an amount of 0.5 to 10% by weight of the weight of ceramic powder in the ceramic layer.

6. The vibration element according to claim 1, wherein the ceramic layer has the same main component as the piezoelectric layer.

7. The vibration element according to claim 1, wherein the piezoelectric layer contains lead zirconate and lead titanate as main components.

8. The vibration element according to claim 1, wherein the substrate is made of alumina with high purity of 99.5 to 99.99% by weight.

9. The vibration element according to claim 1, wherein the piezoelectric element is fixed to the substrate with the ceramic layer therebetween by sintering.

10. The vibration element according to claim 1, wherein vibration energy of the piezoelectric element vibrates the substrate to output vibration energy.

11. A vibration-type driving device comprising the vibration element according to claim 1 as a driving power source.

* * * * *